United States Patent
Osborn et al.

[11] Patent Number: 5,796,278
[45] Date of Patent: Aug. 18, 1998

[54] CIRCUITRY FOR CONTROLLING LOAD CURRENT

[75] Inventors: Douglas Bruce Osborn; Mark Wendell Gose; John Mark Dikeman, all of Kokomo, Ind.

[73] Assignee: Delco Electronics Corporaiton, Kokomo, Ind.

[21] Appl. No.: 637,984

[22] Filed: Apr. 26, 1996

[51] Int. Cl.$^6$ .................................................. H03B 1/00
[52] U.S. Cl. ............................ 327/108; 327/73; 327/323; 327/404; 327/427
[58] Field of Search ............................ 327/72, 73, 108, 327/110, 316, 323, 365, 403, 404, 427, 434, 538, 543, 577

[56] References Cited

U.S. PATENT DOCUMENTS

| | | | |
|---|---|---|---|
| 5,369,308 | 11/1994 | Schoofs et al. | 327/427 |
| 5,408,141 | 4/1995 | Devore et al. | 327/108 |
| 5,500,619 | 3/1996 | Miyasaka | 327/427 |
| 5,650,737 | 7/1997 | Eilley | 327/427 |

*Primary Examiner*—Timothy P. Callahan
*Assistant Examiner*—Jeffrey Zweizig
*Attorney, Agent, or Firm*—Jimmy L. Funke

[57] ABSTRACT

Circuitry for controlling load current, in accordance with the present invention, utilizes a load drive transistor configuration operable to provide a first load current path having a first fraction of load current flowing therethrough and a second load current path having a second smaller fraction of load current flowing therethrough. The circuit includes a sense resistor associated with the load drive transistor to detect various load current threshold values. In order to reduce debiasing effects of the sense resistor upon the second load current path of the load drive transistor, a compensation resistor is provided between drive inputs associated with each of the two current paths. The compensation resistor has a compensation voltage established thereacross which is operable to negate the debiasing effect of the sense resistor on the load driving device.

18 Claims, 3 Drawing Sheets

5,796,278

1

CIRCUITRY FOR CONTROLLING LOAD CURRENT

FIELD OF THE INVENTION

The present invention relates generally to circuitry for controlling load current, and more specifically to such circuitry for controlling load current in response to sensing a fraction of the load current.

BACKGROUND OF THE INVENTION

Circuitry for detecting and/or limiting load current is known and is prevalent in the design of discrete, so-called hybrid and integrated circuitry. Typically, although not exclusively, such circuitry is used in inductive load driving applications. An example of one known circuit arrangement for detecting and/or limiting load current is shown in FIG. 1.

Referring to FIG. 1, circuit 10 includes a MOS power transistor 12 having a drain input 14 connected to a load 16 which is, in turn, connected to a voltage source ($V_S$) 18. Transistor 12 further has a gate input 24 and a source output 20 connected to a sense resistor $R_{SNS}$ 22, which connection defines a node 21. The foregoing circuitry depicts a well known low-side driver arrangement, wherein transistor 12 defines a current path from its drain 14 to its source 20 upon receiving an appropriate drive signal at its gate 24, so that load current $I_L$ may flow therethrough.

Gate 24 of transistor 12 is connected to an output of comparator 26 via signal path 25, which comparator includes an inverting input connected to node 21 via signal path 28 and a non-inverting input connected to a controllable current source 34 via signal path 30. The non-inverting input of comparator 26 is further connected to a resistor $R_1$ 32, and current source 34 is capable of supplying a current $I_1$ which establishes a voltage $V_1$ across $R_1$ 32. Current source 34 includes a control input $C_{IN}$ 35 for receiving a control signal thereat, which control signal may be used to provide current $I_1$ in accordance therewith.

Node 21 is further connected to a non-inverting input of a second comparator 36 via signal path 38. The inverting input of comparator 36 is connected to a voltage source 40, having a voltage $V_2$ associated therewith, via signal path 42. Finally, the output of comparator 36 is connected to current source 34 via signal path 44.

In typical automotive applications, load 16 is an inductive load such as a fuel injector or an ignition coil. With such an inductive load 16, some of the various known operational modes of circuitry 10 will now be described in detail with reference to FIG. 3, which is composed of FIGS. 3A-3C.

A first mode of operation, referred to hereinafter as "peak and hold" operation is shown in FIGS. 3A and 3B. $C_{IN}$ is held at a low level $C_L$ 54 until it is desired to increase current through inductive load 16, at which time $C_{IN}$ is switched to a high level $C_H$ 52. Upon receiving a high level $C_{IN}$ at input 35, current source 34 provides current $I_1$ through $R_1$ 32 which establishes a voltage $V_1$ thereacross. $V_1$ causes the output of comparator 26 to drive the gate 24 of MOS transistor 12 sufficiently to permit a load current $I_L$ equal to that demanded by inductive load 16 to flow therethrough. This initial circuit operation corresponds to the linearly increasing "ramp" portion 56 of FIG. 3B. As $I_L$ increases through $R_{SNS}$ 22, $V_{SNS}$ correspondingly increases. As $V_{SNS}$ increases to $V_2$, the output of comparator 36 switches high and causes current source 34 to decrease $I_1$ to a lower level. Comparator 36 thus acts as a "peak detect" mechanism to detect a peak, or maximum desired, load current $I_p$.

2

When $I_p$ is detected by comparator 36, current source 34 is responsive to the comparator output signal on signal path 44 to switch $I_1$ to a lower level current such that the resulting voltage $V_1$ established across $R_1$ 32 causes comparator 26 to drive the gate 24 of transistor 12 at a decreased level, thereby resulting in a decreasing load current $I_L$ along slope 58. Circuit equilibrium is reached when the voltage $V_1$ established by the lower level current $I_1$ flowing through $R_1$ 32 is equal to the sense voltage $V_{SNS}$ established by the load current $I_L$ flowing through $R_{SNS}$ 22. Under such conditions, the output of comparator 26 is controlled to drive the gate 24 of transistor 12 only sufficiently to maintain a "hold" current $I_H$ 60 through inductive load 16 for the remainder of the control signal $C_{IN}$. At time $t_{OFF}$, a falling edge 50 of $C_{IN}$ occurs and the current $I_1$ of current source 34 is turned off, thereby causing the output of comparator 26 to pull down the gate 24 of transistor 12. Thereafter, the hold current $I_H$ quickly dissipates through resistor $R_{SNS}$ 22, corresponding to decreasing load current 62.

A second known mode of operation of circuit 10, referred to hereinafter as "ramp and hold" operation, is shown in FIGS. 3A and 3C. For such ramp and hold operation, comparator 36 and voltage source $V_2$ 40 are omitted from the circuit. As with the peak and hold operation, current source 34 is responsive to high level control signal $C_H$ at input 35 to permit a current $I_1$ through resistor $R_1$, thereby establishing a voltage $V_1$ thereacross. $V_1$, in turn, causes the output of comparator 26 to drive the gate 24 of transistor 12 sufficiently to permit a load current $I_L$ equal to that demanded by the inductive load 16 to flow therethrough. This initial circuit operation corresponds to the linearly increasing ramp portion 64 of FIG. 3C. Circuit equilibrium is reached when the load current $I_L$ flowing through resistor $R_{SNS}$ 22 establishes a voltage $V_{SNS}$ thereacross equal to $V_1$. Comparator 26 is responsive to this condition to drive the gate of transistor 12 only sufficiently to maintain a hold current $I_H$ 66 flowing through inductive load 16. At time $t_{OFF}$, a falling edge 50 of $C_{IN}$ occurs and the current $I_1$ of current source 34 is turned off, thereby causing the output of comparator 26 to pull down the gate 24 of transistor 12. Thereafter, the hold current $I_H$ quickly dissipates through resistor $R_{SNS}$ 22, corresponding to decreasing load current 68.

Although the foregoing circuit 10 has been widely used, it suffers from several drawbacks. First, to ensure maximum voltage drop across the load 16, it is desirable to minimize the maximum voltage drop $V_{SNS}$ across $R_{SNS}$ 22. However, as $V_{SNS}$ is decreased, it becomes more difficult to accurately detect $V_{SNS}$, and hence, $I_L$. Furthermore, inherent in the design of circuit 10 is the requirement that the entire load current must flow through resistor $R_{SNS}$ 22. Thus, in order to minimize $V_{SNS}$, the value of $R_{SNS}$ 22 must be small, often below 1 ohm in value. For applications requiring large $I_p$ values, this problem is only exacerbated. In order to provide such circuitry 10 on a single integrated circuit, the area required by a diffusion resistor having such a small value can be very large and may, in some applications, be too area intensive to justify. A metal resistor is sometimes used to avoid this area penalty, but due to the physical properties of such a surface film resistor (as opposed to a diffused resistor), the metal may experience large accuracy fluctuations in resistance over the life of the circuit, resulting in increasing error in current detection and/or limiting as the circuit ages.

An alternative approach to circuit 10, which avoids the foregoing shortcomings of circuit 10, involves separating out a small number of source "cells" of transistor 12, and monitoring the small portion of load current $I_L$ flowing therethrough. A known circuit 100 for implementing such an approach is shown in FIG. 2.

Referring to FIG. 2, circuit 100 includes a MOS power transistor 102 having a drain input 104 connected to a load 106 which is, in turn, connected to a voltage source ($V_S$) 108. Transistor 102 further has a gate input 116 and a first source output 110 referenced at ground potential and a second source 112 connected to a sense resistor $R_{SNS}$ 114, which connection defines a node 115. Source 112 of MOS power transistor 102 is formed, in accordance with one known embodiment, by separating a small number of source "cells", or source diffusions, from source 110 so that only a small fraction $I_{SNS}$ of the total load current $I_L$ flows therethrough, and the remaining fraction $I_{L'}$ of the load current $I_L$ flows through source 110. In accordance with another known embodiment of transistor 102, source 112 is formed by providing a smaller transistor in parallel with a larger transistor so that source 112 is correspondingly smaller than source 110. In either case, source 112 is sized with respect to source 110, in a typical application, so that $I_L$ is 100 times larger than $I_{SNS}$.

Gate 116 of transistor 102 is connected to an output of comparator 118 via signal path 120, which comparator includes an inverting input connected to node 115 via signal path 122 and a non-inverting input connected to a controllable current source 128 via signal path 124. The non-inverting input of comparator 118 is further connected to a resistor $R_1$ 126, and current source 128 is capable of supplying a current $I_1$ which establishes a voltage $V_1$ across $R_1$ 126. Current source 128 includes a control input $C_{IN}$ 130 for receiving a control signal thereat, which control signal may be used to provide current $I_1$ in accordance therewith.

Node 115 is further connected to a non-inverting input of a second comparator 132 via signal path 134. The inverting input of comparator 132 is connected to a voltage source 136, having a voltage $V_2$ associated therewith, via signal path 138. Finally, the output of comparator 132 is connected to current source 128 via signal path 140.

Circuit 100 overcomes some of the drawbacks of circuit 10 described herein and can therefore be provided in an area efficient manner in an integrated circuit. Since the current $I_{SNS}$ is much smaller than the total load current $I_L$, circuit 100 effectively permits monitoring of the load current $I_L$ without having as large of a voltage drop taken away from load 106 by $R_{SNS}$ 114. Because the current being monitored by $R_{SNS}$ 114 ($I_{SNS}$) is much smaller than that being monitored by $R_{SNS}$ 22 of circuit 10, it is possible to use a larger valued sense resistor $R_{SNS}$, thereby allowing $R_{SNS}$ to be provided in a more area-efficient manner as a diffusion resistor. Inaccuracy problems associated with the use of a metal resistor are thus avoided.

Although circuit 100 solves some of the problems associated with circuit 10, such as avoiding use of a metal sense resistor and avoiding unwanted voltage drops across the sense resistor, circuit 100 has inherent drawbacks associated therewith. Specifically, the practice of separating out sense cells of MOS transistor 102 can lead to inaccuracies in current detection and/or limiting due to mismatches in the gate 116 to source 110 and gate 116 to source 112 voltages. Owing particularly to a debiasing effect of $R_{SNS}$ on the gate 116 to source 112 voltage, the ratio of $I_{L'}$ to $I_{SNS}$ may not meet design criteria. Such inaccuracies in current detection and/or limiting in an integrated circuit arrangement are only worsened when circuit 100 is subject to temperature and circuit fabrication variations.

Referring again to FIGS. 3A–3C, some of the drawbacks of an inaccurate current ratio ($I_{L'}$ to $I_{SNS}$) within circuit 100 can readily be seen. Referring specifically to FIG. 3B, the "peak and hold" operation of circuit 100 is compared to that of circuit 10. With circuit 100 operating generally as described with respect to circuit 10, the load current $I_L$ increases along slope 56 as before during initial circuit operation. However, due to the debiasing effect of $R_{SNS}$ 114 on the gate 116 to source 112 voltage, the ratio of $I_{L'}$ to $I_{SNS}$ will be greater than the design target. This phenomenon occurs because the gate 116 to source 112 voltage will be less than the gate 116 to source 110 voltage by the amount $V_{SNS}$. With a smaller gate 116 voltage with respect to source 112 than to source 110, the ratio of $I_{L'}$ to $I_{SNS}$ will correspondingly increase. For example, using a known integrated circuit fabrication process with $R_{SNS}$=15 ohms, a target "hold" current $I_H$ of 0.5 amps, and a target ratio $I_{L'}:I_{SNS}$ of 100:1, the debiasing effect of $R_{SNS}$ 114 may result in an error in the target ratio of as much as 20 percent. Thus, if the designed ratio of $I_{L'}:I_{SNS}$ is 100:1, the debiasing effect of $R_{SNS}$ on the gate 116 to source 112 voltage may increase this ratio to approximately 120:1. As a result of this debiasing effect of $R_{SNS}$ 114, as shown in FIG. 3B, the load current $I_L$ will continue to increase, along slope 156, beyond the target peak current value $I_P$. The target sense current $I_{SNS}$ will not be reached until the load current $I_L$ has increased above $I_P$ to an actual peak value of $I_{P'}$. Once the actual peak load current $I_{P'}$ is reached, $I_L$ will decrease, as previously described, but along slope 158 rather than slope 58 as before. Similarly, due to the debiasing effect of $R_{SNS}$ 114 on the gate 116 to source 112 voltage of transistor 102, the actual "hold" current $I_{H'}$ 160 will be greater than the desired hold current $I_H$ 60. However, since transistor 102 is generally operating in the linear region during the "peak" portion of the load current waveform, and in the saturation region during the "hold" portion of the load current waveform, those skilled in the art will recognize that the difference between $I_{P'}$ and $I_P$ will be greater than between $I_{P'}$ and $I_P$. Finally, at time $t_{OFF}$ the load current $I_L$ will dissipate rapidly as previously described. However, since $I_{H'}$ 160 is greater than $I_H$ 60, the current dissipation event will follow slope 162 rather than slope 62, and will thus take longer to occur, specifically by an amount $Dt_1$.

Referring now to FIG. 3C, the "ramp and hold" operation of circuit 100 is compared to that of circuit 10. As with the ramp and hold operation of circuit 10, the load current $I_L$ of circuit 100 initially increases along slope 64. As with the peak and hold operation of circuit 100, however, the debiasing effect of $R_{SNS}$ 114 on the gate 116 to source 112 voltage causes $I_L$ to continue to increase along slope 164 to an ultimate hold current $I_{H'}$ 166 which is greater than the target $I_H$ 66. At time $t_{OFF}$ the load current $I_L$ dissipates rapidly as previously described. Again, however, since $I_{H'}$ 166 is greater than $I_H$ 66, the current dissipation event will follow slope 168 rather than slope 68, and will thus take long to occur, namely by an amount $Dt_2$.

Although circuit 100 solves some of the problems associated with circuit 10, such as avoiding use of a metal sense resistor and avoiding unwanted voltage drops across the sense resistor, circuit 100 thus has at least two disadvantages associated therewith. First, the load current $I_L$ will operate, in any of the disclosed modes of operation, at higher levels than targeted. Such operation results in undue wear upon the load, which is typically an automotive fuel injector or ignition coil, and may therefore shorten its useful lifetime. Secondly, and oftentimes more critical to the system designer, inaccuracies in load "turn-off" times, as evidenced by $Dt_1$ and $Dt_2$, may result in reduced fuel economy when load 106 is a fuel injector, or inaccurate spark timing when load 106 is an ignition coil.

What is therefore needed is a load current detection and/or limiting circuit which more accurately detects and/or limits load current $I_L$ at target load current levels, and which does not suffer from the disadvantages of using metal film sense resistors and of having large voltage drops across the sense resistor. Such a circuit should be easily integrated, preferably using known circuit fabrication techniques.

SUMMARY OF THE INVENTION

The forgoing shortcomings of the prior art are addressed by the present invention. In accordance with one aspect of the present invention, circuitry for controlling load current through a load comprises means responsive to a load drive signal for permitting a first percentage of the load current to flow therethrough, means responsive to a sense drive signal for permitting a second percentage of the load current to flow therethrough, means responsive to the second percentage of the load current for providing a sense voltage corresponding thereto, means responsive to a control signal and a predefined level of the sense voltage to provide the load drive signal at a sufficient level thereof to maintain the load current at a predefined load current level, and means responsive to the load drive signal for providing the sense drive signal.

In accordance with another aspect of the present invention, circuitry for controlling load current through a load comprises a load driver connected to the load and having first and second drive inputs, wherein the load driver is operable to conduct a first fraction of the load current therethrough in response to a load drive signal at the first drive input, and a second fraction of the load current therethrough in response to a sense drive signal at the second drive input. A sense resistor is connected to the load driver and defines a sense voltage thereacross in response to the second fraction of load current flowing therethrough. A first control circuit receives a control signal at a first input and the sense voltage at a second input, and is responsive to the control signal and a predefined level of the sense voltage to provide the load drive signal at a level thereof sufficient to maintain the load current at a predefined load current level. A compensation resistor connects the first and second drive inputs, and receives the load drive signal from the first drive input and provides the sense drive signal to the second drive input, wherein the compensation resistor is operable to maintain the second fraction of load current through the sense resistor.

One object of the present invention is to provide a circuit for accurately controlling load current.

Another object of the present invention is to provide such a circuit that is responsive to only a fraction of the load current to accurately control the load current.

Yet another object of the present invention is to provide such a circuit in the form of an integrated circuit.

Still another object of the present invention is to provide such a circuit that is designed for accurate operation by compensating for semiconductor processing and operating temperature variations.

These and other objects of the present invention will become more apparent from the following description of the preferred embodiment.

DESCRIPTION OF THE PREFERRED EMBODIMENT

Figure 1:
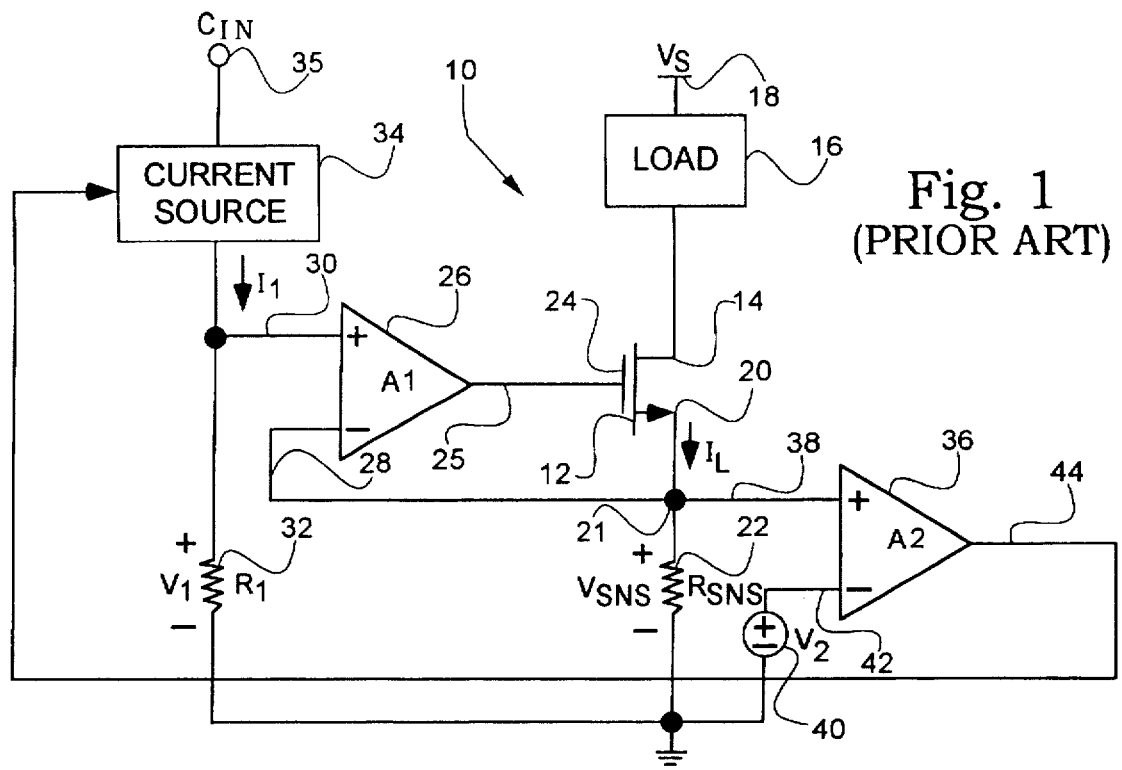
FIG. 1 is a schematic diagram of an example of a prior art circuit for controlling load current.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 4:
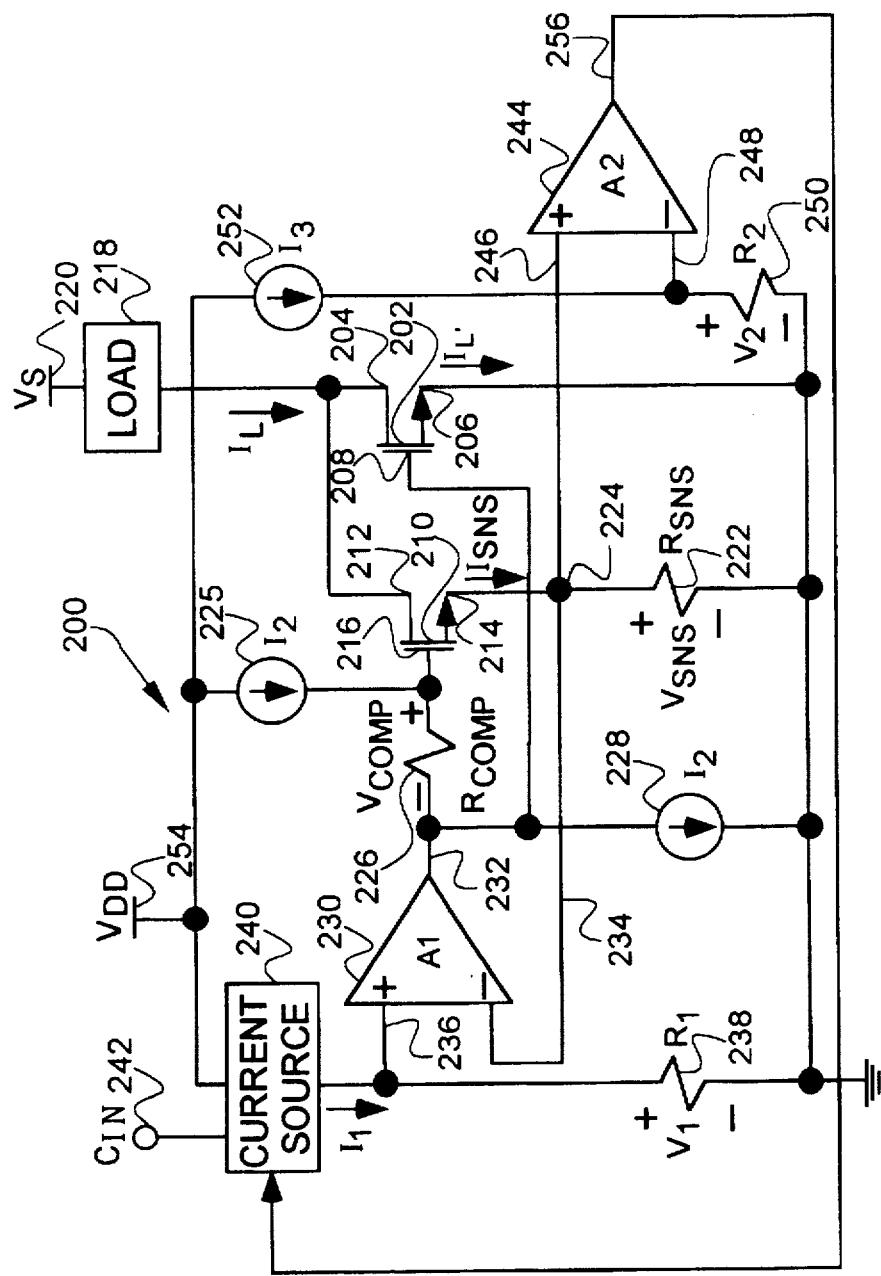
FIG. 4 is a schematic diagram of a circuit for controlling load current according to the present invention.

Referring now to FIG. 4, a circuit 200 is shown, in accordance with the present invention, for accurately controlling load current. Circuit 200 includes a first transistor 202 having a drain 204 connected to one end of a load 218, a gate input 208 and a source output 206. The opposite end of load 218 is connected to a voltage source $V_S$ 220. In a typical automotive application, load 218 is an inductive load, such as a fuel injector or an ignition coil, and $V_S$ 220 is an automotive ignition system supplying a voltage of between approximately 7 and 24 volts. However, it should be pointed out that the present invention contemplates that load 218 may be some other reactive or purely resistive load, and that $V_S$ 220 may be any known voltage source.

A second transistor 210 includes a drain 212 connected to the drain 204 of transistor 202, a gate input 216 and a source output 214 connected to a circuit node 224. Preferably, transistors 202 and 210 are power MOSFETs (metal-oxide-semiconductor field effect transistor) as shown in FIG. 4, although the present invention contemplates that transistors 202 and 210 may also be junction field effect transistors (JFETS) or other insulated gate field effect transistors (IGFETS). Further, it should be pointed out that the present invention contemplates merging transistors 202 and 210 into a single device having a common drain 204/212. An example of one merged MOS transistor variant is a so-called insulated gate bipolar transistor (IGBT), the details of which are given in U.S. patent application Ser. No. 08/508,402, filed Jul. 31, 1995 by Shreve et al. and having Att. Docket No. H-194,580, entitled IGNITION COIL DRIVER MODULE INCLUDING COIL CURRENT LIMITING FEATURE, which is assigned to the assignee of the present invention, and which patent application is herein incorporated by reference.

The gate 216 of transistor 210 is connected to a current source 225 and to one end of a compensation resistor $R_{COMP}$ 226. The opposite end of $R_{COMP}$ 226 is connected to the gate 208 of transistor 202 and to a current source 228. The combined connection of $R_{COMP}$ 226, gate 208 of transistor 202 and current source 228 are connected to an output of a comparator 230 via signal path 232.

Comparator 230 includes a non-inverting input connected to a controllable current source 240 and to one end of a resistor $R_1$ 238 via signal path 236. Controllable current source 240 also has an input $C_{IN}$ 242 for receiving a control signal thereat. Comparator 230 further includes an inverting input connected to circuit node 224 via signal path 234.

Circuit node 224 is further connected to one end of a sense resistor $R_{SNS}$ 222, and to a non-inverting input of a comparator 244 via signal path 246.

Comparator 244 further includes an inverting input 248 connected to a resistor $R_2$ 250 and to a current source 252 via signal path 248. The output of comparator 244 is connected to controllable current source 240 via signal path 256. Current sources 225, 240 and 252 are each connected to circuit power source $V_{DD}$ 254, which power source may be a regulated or unregulated supply, typically supplying circuit voltages of between approximately 5.0–16.0 volts.

Figure 2:
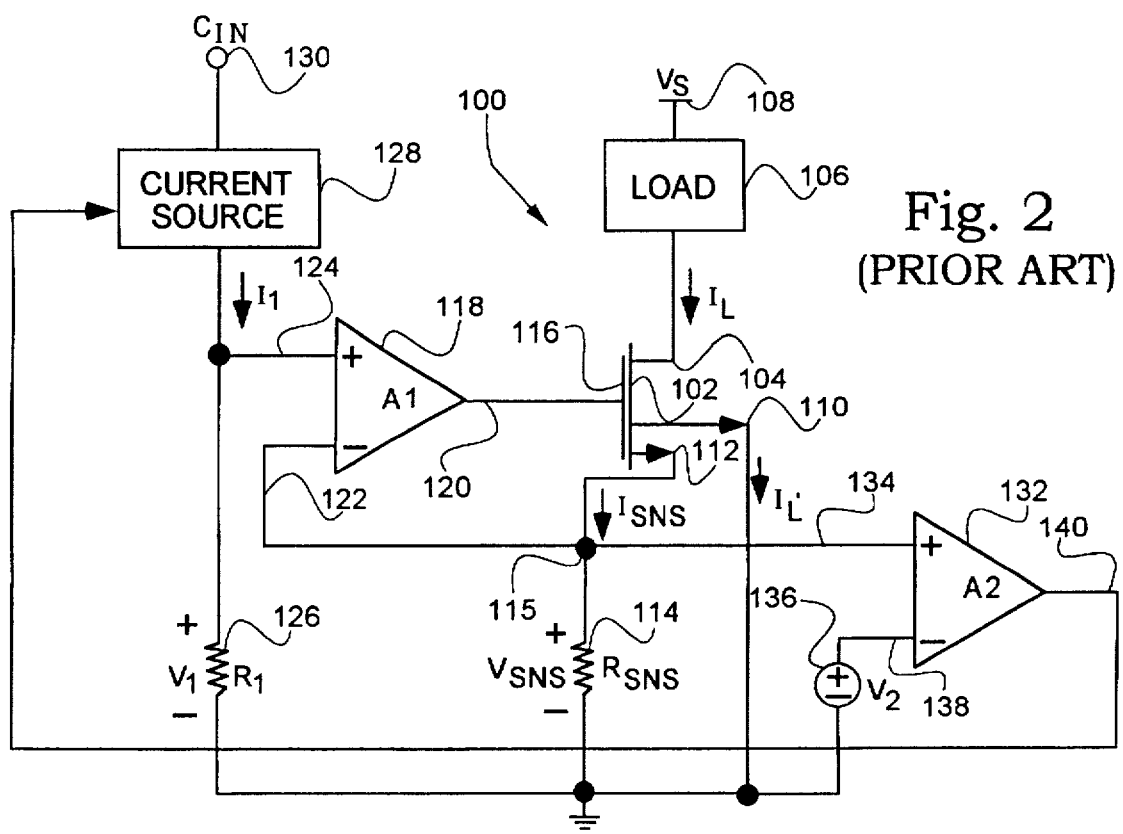
FIG. 2 is a schematic diagram of an example of another prior art circuit for controlling load current.
Figure 3A:
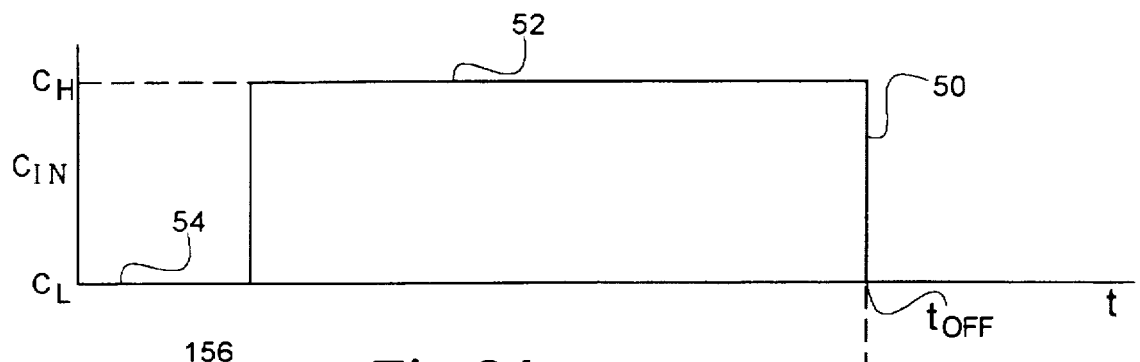
FIG. 3 is composed of FIGS. 3A, 3B, and 3C that illustrates various operating modes of the load current controlling circuits of FIGS. 1 and 2.
Figure 3B:
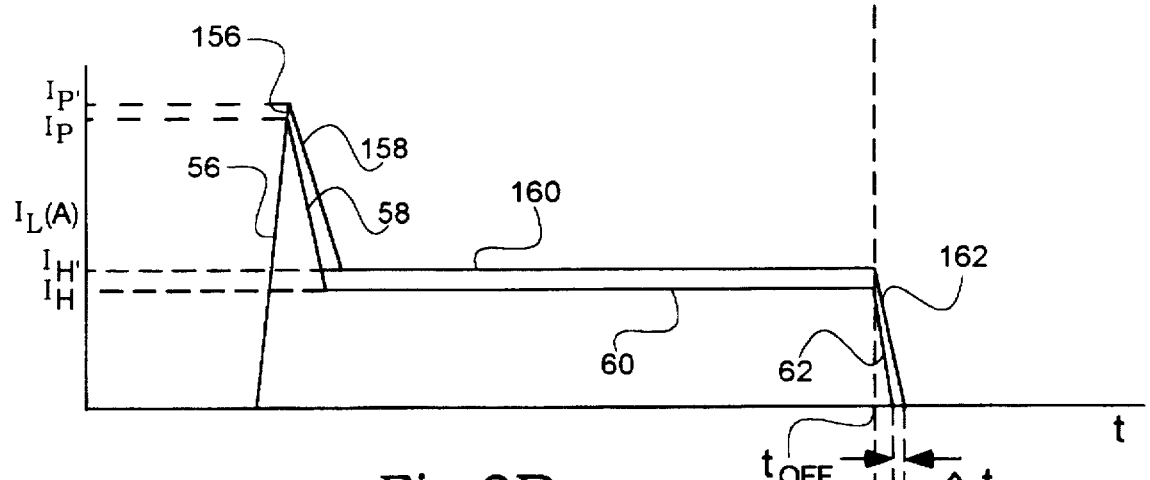
Figure 3C:
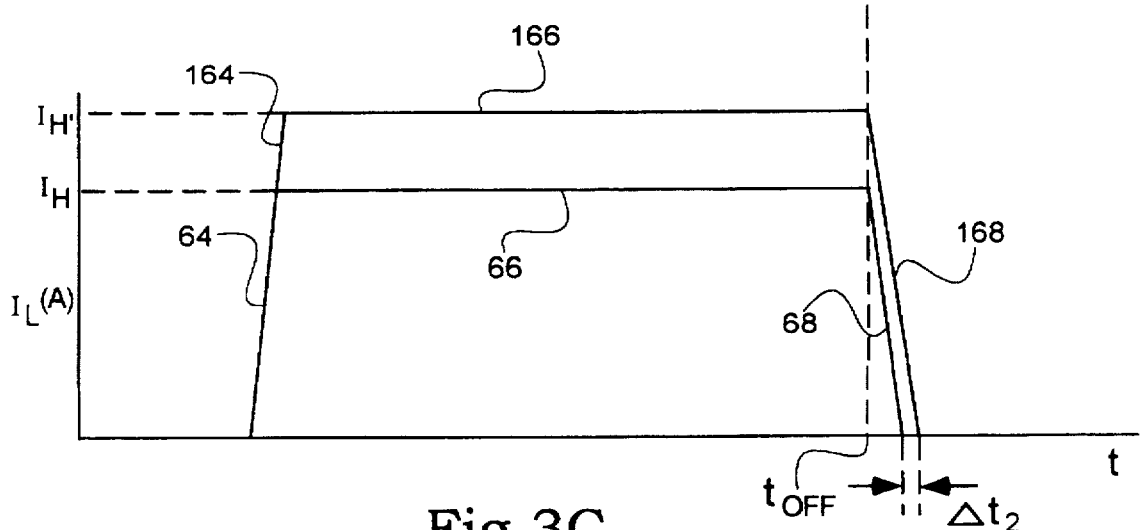

With an inductive load 218, circuit 200 is operable in either of the modes shown and discussed with respect to FIGS. 3A–3C to produce the waveforms corresponding to those produced by circuit 10 (FIG. 1), yet circuit 200 includes the benefits discussed with respect to circuit 100 (FIG. 2).

Referring now to FIGS. 3A and 3B, operation of circuit 200 to provide "peak and hold" operation will be described. $C_{IN}$ is held at a low level $C_L$ 54 until it is desired to increase current through inductive load 218, at which time $C_{IN}$ is switched to a high level $C_H$ 52. Upon receiving a high level $C_{IN}$ at input 242, current source 240 provides current $I_1$ through $R_1$ 238 which establishes a voltage $V_1$ thereacross. $V_1$ causes the output of comparator 230 to drive the gate 208 of transistor 202 sufficiently to permit a load current $I_L$, equal to that demanded by inductive load 218 to flow therethrough. The output of comparator 230 also drives the gate 216 of transistor 210 sufficiently to permit a sense current $I_{SNS}$ to flow therethrough. The total load current $I_L$ flowing through load 218 is equal to the sum of $I_L$ and $I_{SNS}$.

Due to the inclusion of $R_{COMP}$ 226 and current sources 225 and 228, a voltage $V_{COMP}$ is established across $R_{COMP}$ 226, wherein the voltage at gate 216 of transistor 210, when $V_{COMP}$ is established, is larger than the voltage at gate 208 of transistor 202. Current sources 225 and 228 each supply a current $I_2$ in the direction shown so that when the output of comparator 230 is low, transistor 202 is off and $V_{COMP}$ is too small to turn on transistor 210. When comparator 230 turns on, output 232 provides a drive voltage to gates 208 and 216 of transistors 202 and 210, respectively, wherein the drive voltage to gate 216 of transistor 210 is supplemented by the voltage $V_{COMP}$. Thus, when the output of comparator 230 turns on, the gate-to-source voltage, $V_{GS}$, of transistor 210 is equal to the gate-to-source voltage, $V_{GS}$, of transistor 202+$V_{COMP}$−$V_{SNS}$. Current sources 225 and 228, $R_{COMP}$ 226, and $R_{SNS}$ 222 are all preferably designed so that $V_{COMP}$=$V_{SNS}$ and $V_{GS}$ of transistor 202 therefore directly tracks $V_{GS}$ of transistor 210 when $I_L$=$I_H$. In this manner, the target current ratio of $I_L$:$I_{SNS}$ is maintained and circuit 200 is operable to reproduce the $I_L$ waveform produced by circuit 10.

The foregoing initial circuit operation corresponds to the linearly increasing "ramp" portion 56 of FIG. 3B. As $I_L$ increases through $R_{SNS}$ 222, $V_{SNS}$ correspondingly increases. Current source 252 provides a current $I_3$ which establishes a voltage $V_2$ across $R_2$ 250, and as $V_{SNS}$ increases to $V_2$, the output of comparator 244 switches high and causes current source 240 to decrease $I_1$ to a lower level. Comparator 244 thus acts as a "peak detect" mechanism to detect a peak, or maximum desired, load current $I_p$.

When $I_p$ is detected by comparator 244, current source 240 is responsive to the comparator 244 output signal on signal path 256 to switch $I_1$ to a lower level current such that the resulting voltage $V_1$ established across $R_1$ 238 causes comparator 230 to drive the gate 208 of transistor 202 and gate 216 of transistor 210 at a decreased level, thereby resulting in a decreasing load current $I_L$ along slope 58. Circuit equilibrium is reached when the voltage $V_1$ established by the lower level current $I_1$ flowing through $R_1$ 238 is equal to the sense voltage $V_{SNS}$ established by the sense current $I_{SNS}$ flowing through $R_{SNS}$ 222. Under such conditions, the output of comparator 230 is controlled to drive the gates 208 and 216 of transistors 202 and 210 sufficiently to maintain a target "hold" current $I_H$ 60 through inductive load 218 for the remainder of the control signal $C_{IN}$. With the inclusion of $R_{COMP}$ between the output 232 of comparator 230 and the gate 216 of transistor 210, transistors 202 and 210 are operable as previously described to maintain the "hold" current $I_H$ 60 through inductive load 218. At time $t_{OFF}$ a falling edge 50 of $C_{IN}$ occurs and the current $I_1$ of current source 240 is turned off, thereby causing the output of comparator 230 to pull down the gates 208 and 216 of transistors 202 and 210, respectively. Thereafter, the hold current $I_H$ quickly dissipates through resistor $R_{SNS}$ 222, corresponding to the decreasing load current $I_L$ along slope 62.

By omitting comparator 244, current source 252 and resistor $R_2$ 250 from the circuit, circuit 200 is operable to provide the ramp and hold operation of FIG. 3C. As with the peak and hold operation, current source 240 is responsive to high level control signal $C_H$ at input 242 to permit a current $I_1$ to flow through resistor $R_1$, thereby establishing a voltage $V_1$ thereacross. $V_1$, in turn, causes the output of comparator 230 to drive transistors 202 and 210, in a manner described above, sufficiently to permit a load current $I_L$ equal to that demanded by the inductive load 218 to flow therethrough. This initial circuit operation corresponds to the linearly increasing ramp portion 64 of FIG. 3C. Circuit equilibrium is reached when the sense current $I_{SNS}$ flowing through resistor $R_{SNS}$ 222 establishes a voltage $V_{SNS}$ thereacross approximately equal to $V_1$. Comparator 230 is responsive to this condition to drive transistors 202 and 210 only sufficiently to maintain a hold current $I_H$ 66 flowing through inductive load 218. At time $t_{OFF}$ a falling edge 50 of $C_{IN}$ occurs and the current $I_1$ of current source 240 is turned off, thereby causing the output of comparator 230 to pull down the gates 208 and 216 of transistors 202 and 210, respectively. Thereafter, the hold current $I_H$ quickly dissipates through resistor $R_{SNS}$ 222, corresponding to decreasing load current $I_L$ along slope 68.

In a typical application, circuit 200 is an integrated circuit and load 218 is an automotive fuel injector. The $I_L$:$I_{SNS}$ ratio is set at 100:1, and resistors $R_{COMP}$ 226 and $R_1$ 238 are formed from a single diffusion and well matched in their layout to minimize semiconductor fabrication process and operating temperature variations. $R_{SNS}$ 222 is not required to match $R_{COMP}$ 226 and $R_1$ 238, although $I_1$ must track the operating temperature and fabrication process variations of the $R_{SNS}$ 222 diffusion in order for the current limiting threshold to be constant over those variations. $I_2$ is preferably a function of $I_1$, and the values of $I_2$ and $R_{COMP}$ 226 are chosen so that the voltages $V_1$ and $V_{COMP}$ are equal. When the circuit 200 is at its current limiting threshold, $V_{SNS}$, $V_1$ and $V_{COMP}$ are all equal. In this manner, semiconductor fabrication process variations and circuit operating temperature variations have minimal effect on the operating characteristics of circuit 200, and the target 100:1 ratio of $I_L$:$I_{SNS}$ is restored without the debiasing effect of $R_{SNS}$ 222.

It should now be appreciated that circuit 200 of the present invention utilizes the advantages of the transistor 102 configuration of FIG. 2 to provide an accurate load current controlling circuit. The debiasing effect of the sense resistor $R_{SNS}$ 222 is negated by the compensation resistor $R_{COMP}$ 226, thereby allowing for adjustment of peak and/or hold current thresholds simply by adjusting the values of $I_1$ and $I_2$, and thereby providing a more stable load current threshold control over semiconductor fabrication processing and circuit operating temperature variations.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected. For example, although the sense current $I_{SNS}$ is typically a small fraction of load current $I_L$, the present invention contemplates that $I_{SNS}$ may be a much larger fraction of $I_L$, and may in fact exceed that of $I_L$. As a second example, although the circuitry of the present invention is shown as being configured in a so-called low-side driver arrangement, those skilled in the art will recognize that the concepts described herein may easily be utilized to provide a so-called high-side driver arrangement.

The embodiments of the invention in which an exclusive property or privilege is claimed are defined as follows:

1. Circuitry for controlling load current through a load comprising:

means responsive to a load drive signal for permitting a first percentage of the load current to flow therethrough;

means responsive to a sense drive signal for permitting a second percentage of the load current to flow therethrough;

means responsive to said second percentage of the load current for providing a sense voltage corresponding thereto;

means responsive to a control signal and a predefined level of said sense voltage to provide said load drive signal at a sufficient level thereof to maintain the load current at a predefined load current level; and a compensation resistor having a first end connected to said means for permitting a first percentage of the load current to flow therethrough and a second end connected to said means for permitting a second percentage of the load current to flow therethrough, said compensation resistor receiving said load drive signal at said first end and providing said sense drive signal at said second end thereof, said compensation resistor operable to cancel debiasing effects of said sense resistor upon said second transistor.

2. The circuitry of claim 1 further including means responsive to a reference voltage and said predefined level of said sense voltage to detect a peak load current and provide said control signal corresponding thereto.

3. The circuitry of claim 2 wherein said peak load current is greater than said predefined load current level.

4. The circuitry of claim 3 wherein said second percentage of the load current is less than said first percentage of the load current.

5. The circuitry of claim 1 wherein said means for permitting a first percentage of the load current to flow therethrough includes a first transistor having a first input connected to the load, a second input and an output, said first transistor operable to conduct said first fraction of the load current from said first input to said output in response to said load drive signal at said second input.

6. The circuitry of claim 5 wherein said means for permitting a second percentage of the load current to flow therethrough includes a second transistor having a first input connected to said first input of said first transistor, a second input and an output, said second transistor operable to conduct said second fraction of the load current from said first input to said output thereof in response to said sense drive signal at said second input thereof.

7. The circuitry of claim 6 wherein said means responsive to said second percentage of the load current to provide a sense voltage corresponding thereto includes a sense resistor connected to said output of said second transistor, said sense resistor having said sense voltage thereacross defined by said second fraction of the load current flowing therethrough.

8. The circuitry of claim 1 wherein said second fraction of the load current is a predefined ratio of said first fraction of the load current.

9. The circuitry of claim 8 wherein the load is an inductive load.

10. The circuitry of claim 9 wherein said inductive load is a fuel injector of a motor vehicle fuel system.

11. Circuitry for controlling load current through a load comprising:

a load driver connected to the load and having first and second drive inputs, said load driver operable to conduct a first fraction of the load current therethrough in response to a load drive signal at said first drive input, and a second fraction of the load current therethrough in response to a sense drive signal at said second drive input;

a sense resistor connected to said load driver, said sense resistor defining a sense voltage thereacross in response to said second fraction of load current flowing therethrough;

a first control circuit receiving a control signal at a first input and said sense voltage at a second input, said control circuit responsive to said control signal and a predefined level of said sense voltage to provide said load drive signal at a level thereof sufficient to maintain the load current at a predefined load current level;

a compensation resistor connecting said first and second drive inputs, said compensation resistor receiving said load drive signal from said first drive input and providing said sense drive signal to said second drive input, said compensation resistor operable to maintain said second fraction of load current through said sense resistor; and a current source connected to said compensation resistor, said current source establishing a voltage drop across said compensation resistor approximately equal to said predefined level of said sense voltage.

12. The circuitry of claim 11 further including a second control circuit responsive to a reference voltage and said sense voltage to detect a peak level of said second fraction of the load current and provide said control signal in response thereto.

13. The circuitry of claim 12 wherein said first fraction of the load current is greater than said second fraction of the load current.

14. The circuitry of claim 11 wherein said first and second control circuits each include a comparator.

15. The circuitry of claim 11 wherein said load driver is a power transistor.

16. The circuitry of claim 11 further including a reference resistor connected to said first load driver input;

and wherein said control signal is a current level operable to establish a voltage drop across said reference resistor approximately equal to said predefined level of said sense voltage.

17. The circuitry of claim 11 wherein the load is an inductive load.

18. The circuitry of claim 17 wherein said inductive load is a fuel injector of a motor vehicle fuel system.

* * * * *